US005789809A

United States Patent [19]
Joshi

[11] Patent Number: 5,789,809
[45] Date of Patent: Aug. 4, 1998

[54] THERMALLY ENHANCED MICRO-BALL GRID ARRAY PACKAGE

[75] Inventor: Rajeev Joshi, Sunnyvale, Calif.

[73] Assignee: National Semiconductor Corporation, Santa Clara, Calif.

[21] Appl. No.: 517,603

[22] Filed: Aug. 22, 1995

[51] Int. Cl.⁶ .................. H01L 23/12; H01L 23/10; H01L 23/34; H01L 23/48
[52] U.S. Cl. .................. 257/704; 257/707; 257/712; 257/778
[58] Field of Search ................. 257/704, 707, 257/712, 730, 778, 706

[56] References Cited

U.S. PATENT DOCUMENTS

| 3,449,640 | 6/1969 | Franklin | 257/704 |
| 5,016,138 | 5/1991 | Woodman | 257/712 |
| 5,409,865 | 4/1995 | Karnezos | 257/738 |

FOREIGN PATENT DOCUMENTS

| 57-21845 | 2/1982 | Japan | 257/704 |
| 382144 | 4/1991 | Japan | 257/704 |
| 5-95053 | 4/1993 | Japan | 257/704 |
| 5267486 | 10/1993 | Japan | 257/704 |

Primary Examiner—Teresa M. Arroyo
Attorney, Agent, or Firm—Beyer & Weaver, LLP

[57] ABSTRACT

An integrated circuit package includes a die and an electrically conductive cap attached to the top surface of the die. The die has a top surface, a bottom surface, an edge surface, a plurality of input/output terminals on the bottom surface of the die, and an input/output terminal pad on the top surface of the die. An electrically conductive arrangement is electrically connected to the input/output terminals on the bottom surface of the die providing an arrangement for electrically connecting the input/output terminals on the bottom surface of the die to other electrical elements. The electrically conductive cap attached to the top surface of the die provides an arrangement for electrically connecting the input/output terminal on the top surface of the die to other electrical elements and may be used to provide improved heat dissipation from the die.

13 Claims, 2 Drawing Sheets

1

THERMALLY ENHANCED MICRO-BALL GRID ARRAY PACKAGE

BACKGROUND OF THE INVENTION

The present invention relates generally to an integrated circuit package and more specifically to a micro ball grid array integrated circuit package including a die and an electrically conductive cap attached to the top surface of the die.

In the field of integrated circuit packages, the physical size of an integrated circuit package is an ongoing concern. To address this concern, conventional Micro Ball Grid Array (μGBGA) packages have been developed such as the μPBGA package illustrated in FIG. 1 and generally designated by reference numeral 10. Package 10 includes a die 12 having a bottom surface 14, a peripheral edge surface 16, a top surface 18, and a plurality of input/output terminals 20 located on bottom surface 14. An annular ring 22 surrounds the peripheral edge 16 of die 12 providing a protective shell around the peripheral edge of the die which holds the various elements of the packaged together. An elastomer layer 24 is attached to bottom surface 14 of the die which acts as a compliant layer to absorb physical shock to the package and help prevent the package from becoming electrically disconnected from other electrical elements as a result of the physical shocks. Package 10 also includes a polyimide film 26 having i) a top surface 27 which is attached to the bottom surface of elastomer film 24, ii) a bottom surface 28 with a plurality of electrically conductive contacts or bumps 30 attached to bottom surface 28, iii) a plurality of electrically conductive contact pads 32 on its top surface 27, and iv) a plurality of electrically conductive vias or traces illustratively represented by line 34 in FIG. 1 electrically connecting respective ones of contact pads 32 to a corresponding contact or bump 30. An array of bonding wires 36 electrically connect respective ones of input/output terminals 20 to corresponding ones of contact pads 32 on top surface 27 of polyimide film 26 thereby electrically connecting each input/output terminal to a corresponding one of the electrically conductive contacts or bumps 30 on bottom surface 28 of polyimide film 26. Finally, package 10 includes an encapsulating material 38 surrounding bonding wires 36 which is intended to prevent damage to or electrical shorting of bonding wires 36.

As shown in FIG. 1 this package arrangement provides a very small package which is only slightly larger in area than the area of the die. However, this package arrangement has definite limitations. For instance, in the case of discrete transistors or D-MOS FETs in which the die includes a backside contact or input/output terminal, this package arrangement will not work. Also, the heat dissipating characteristics of this package are somewhat limited. In situations where enhanced thermal dissipation is required, an external heat sink must be attached to the package increasing the cost of the overall package and increasing the size of the package.

FIG. 2 illustrates a conventional 8 lead SOIC package, generally designated by reference numeral 40, which is commonly used in applications requiring D-MOS FET devices packaged in small outline surface mount packages. Package 40 includes a die 42 having front side or surface 44 with a source contact or terminal pad 46 and a gate contact 48 on front surface 44. Die 42 also includes a backside surface (not shown in FIG. 2) which serves as a drain contact. Package 40 also includes a lead frame 50 having eight leads 52a–h, an array of bonding wires 54, and an encapsulating material 56 surrounding the die. Leads 52 are electrically connected to the source, drain, and gate contacts on die 42 using bonding wires 54. In this example, lead 52a is connected to gate contact 48 and leads 52b–d are connected to source contact 46 on front surface 44 of die 42. Leads 52e–h are electrically connected to the drain contact on the back surface (not shown) of die 42. Encapsulating material 56 surrounds and encapsulates die 42, bonding wires 54, and portions of lead frame 50 such that leads 52 protrude out from the package thereby providing an arrangement for electrically connecting die 42 to other electrical elements.

Although the package arrangement illustrated in FIG. 2 does allow for the use of a die with a back side contact or terminal pad, this arrangement also has drawbacks. First, this package arrangement increases the required size of the package for a given die in both height and area by adding the lead frame with the protruding leads and the additional required encapsulating material. The lead frame also increases the cost of the overall package. Furthermore, since several leads are used to electrically connect the source and the drain to other electrical elements, there is a potential problem with spreading resistance. And finally, the heat dissipating path runs from the die through the leads to the electrical element to which the package is attached (for example a PC board). In applications where active cooling is not possible, this heat dissipating path limits the heat dissipating capabilities of this package.

The present invention discloses an improved μGBGA package which may be used in situations where the die includes a backside contact thus providing a smaller package than is possible using the conventional 8 lead SOIC package. This new package eliminates the requirement for a leadframe and eliminates several of the process steps required to produce the package therefore reducing the cost of the package. This novel μBGA package also provides improved heat dissipation when compared with the conventional μBGA package shown in FIG. 1.

SUMMARY OF THE INVENTION

As will be described in more detail hereinafter, an integrated circuit package including a die and an electrically conductive cap attached to the top surface of the die is disclosed. The die has a top surface, a bottom surface, an edge surface, a plurality of input/output terminals on the bottom surface of the die, and an input/output terminal pad on the top surface of the die. An electrically conductive arrangement is electrically connected to the input/output terminals on the bottom surface of the die providing an arrangement for electrically connecting the input/output terminals on the bottom surface of the die to other electrical elements. The electrically conductive cap attached to the top surface of the die provides an arrangement for electrically connecting the input/output terminal on the top surface of the die to other electrical elements and may be used to provide improved heat dissipation from the die.

In one embodiment, the electrically conductive arrangement attached to the input/output terminals on the bottom of the die has a plurality of lowermost individual electrically conductive members disposed within a common plane which are adapted to be electrically connected to other electrical elements. The cap has an inverted cup shape and includes a base member and at least one downwardly projecting sidewall. The base member has an inner top surface to which input/output terminal on the top surface of the die is attached. The sidewall extends downward below the bottom surface of the die and the sidewall has a bottom edge surface located in the same plane as the common plane in which the electrically conductive members are disposed. The sidewall is adapted to be electrically connected to other electrical elements, thereby electrically connecting the input/output terminal on the top surface of the die to the other electrical elements.

In another embodiment, the sidewall extends continuously around the base member of the cap and the bottom edge surface of the sidewall of the cap is solder plated. The solder plating is adapted to facilitate electrically connecting the edge surface of the cap to other electrical elements such as a circuit board.

BRIEF DESCRIPTION OF THE DRAWINGS

The features of the present invention may best be understood by reference to the following description of the presently preferred embodiments together with the accompanying drawings in which.

DETAILED DESCRIPTION OF THE INVENTION

Figure 1:
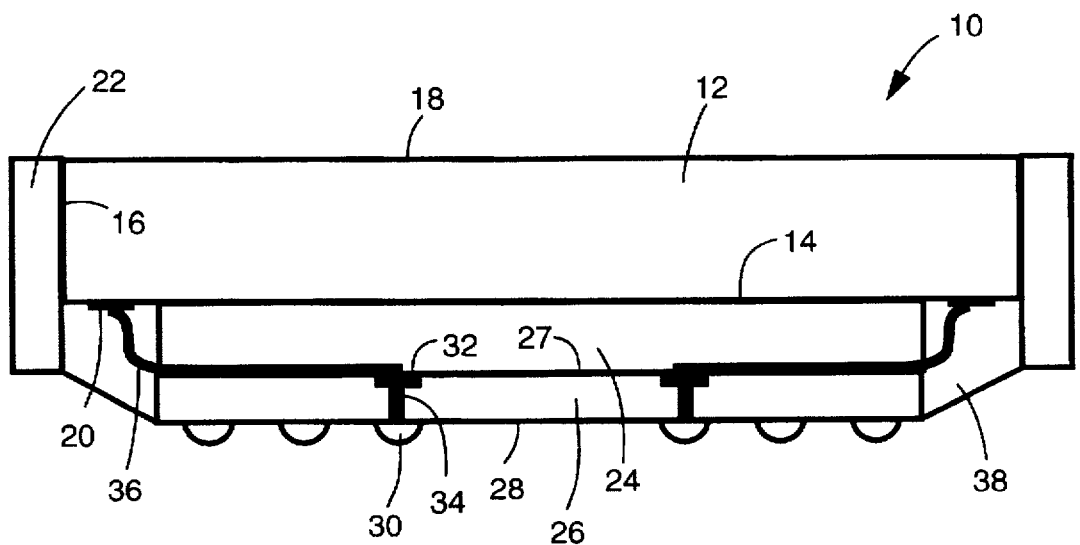
FIG. 1 is an elevational diagrammatic illustration of a prior art μGBGA integrated circuit package.
Figure 2:
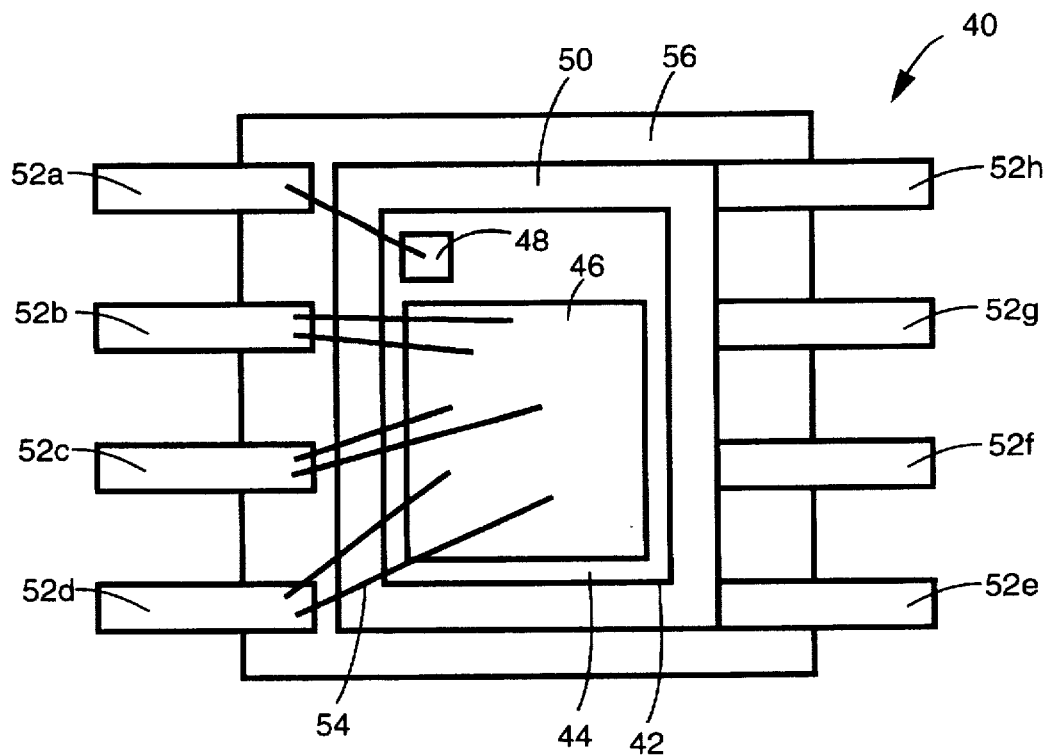
FIG. 2 is a plan view diagrammatic illustration of a prior art eight lead SOIC package.
Figure 3A:
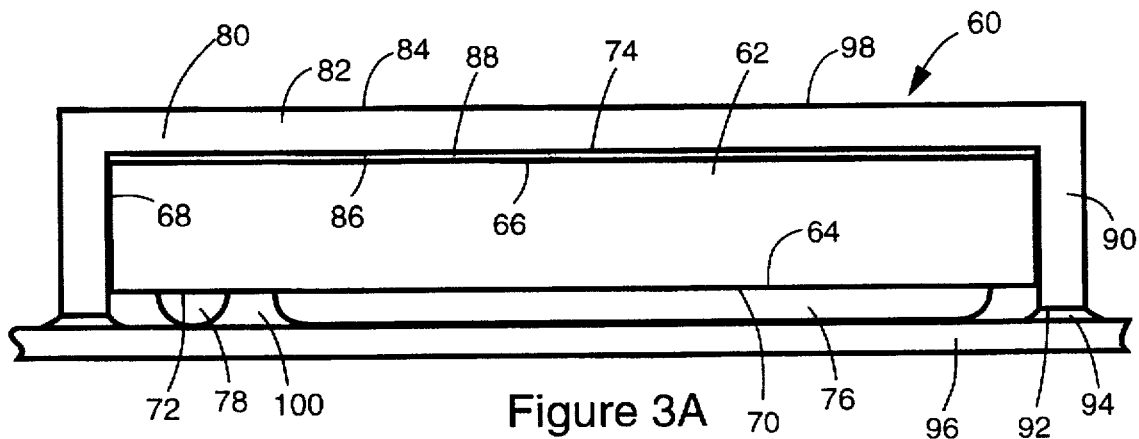
FIG. 3A is an elevational diagrammatic illustration of an integrated circuit package designed in accordance with a first embodiment of the present invention.
Figure 3B:
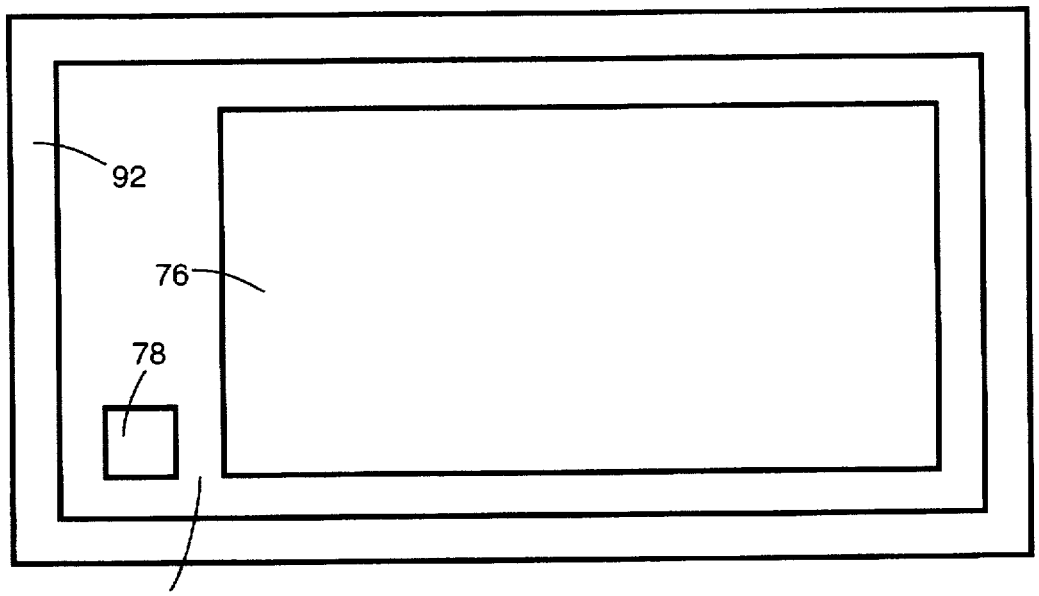
FIG. 3B is a plan view diagrammatic illustration of the integrated circuit package shown in FIG. 3A.

Having described FIGS. 1 and 2 previously, attention is directed to FIGS. 3A and 3B, which illustrate an integrated circuit package generally designated by the reference numeral 60 and designed in accordance with the present invention. Package 60 includes a die 62 having a front side or bottom surface 64, a back side or top surface 66, and an edge surface 68. In the side view of the package illustrated in FIG. 3A, front side or bottom surface 64 is facing down and back side or top surface 66 is facing up. Die 62 may be a wide variety of different types of die, however, in the embodiment illustrated in FIGS. 3A and 3B, die 62 is a discrete transistor having a relatively large source contact or input/output terminal 70 and a gate contact or input/output terminal 72 on the die's front side surface 64 and a drain contact or input/output terminal 74 on its back side surface 66. Drain input/output terminal 74 on back side 66 is relatively large and covers the entire back side surface 66 of die 62. Die 62 also includes a relatively large solder bump or electrical contact 76 formed on source input/output terminal 70 and a solder bump or electrical contact 78 formed on gate input/output terminal 72.

Still referring to FIGS. 3A and 3B, package 60 also includes an electrically conductive cap 80 having a base member 82 with a top surface 84 and a bottom surface 86. Bottom surface 86 of cap 80 is attached to the back side 66 of die 62 using and electrically conductive material 88 thereby electrically connecting drain input/output terminal 74 to cap 80. Material 88 may be an electrically conductive epoxy or any other conventional electrically conductive die attach material. In this embodiment, cap 80 also includes a downwardly projecting side wall 90 which surrounds edge 68 of die 62 and extends downward below front or bottom surface 64 of die 62. Sidewall 90 has a bottom edge surface 92 which is solder plated with solder material 94 in order to allow edge surface 92 to be electrically attached to another electrical element such as a PC board, indicated by reference numeral 96. Edge surface 92 of sidewall 90 is positioned such that edge surface 92 is in a common plane with the bottom surfaces of solder bumps 76 and 78. This arrangement allows solder bumps 76 and 78 and edge surface 92 of cap 80 all to be electrically attached or soldered to electrical element 96 thereby electrically connecting die 62 to element 96.

In this embodiment, cap 80 may also include an electrically non-conductive coating 98 on the caps outer surface. This coating prevents the electrical shorting of the cap and therefore the drain contact of the die to other electrically conductive materials which may come into contact with the outer surface of the cap. Furthermore, cap 80 may be made from a thermally conductive material allowing cap 80 to also act as a heat sink. Because cap 80 is directly attached to die 62 along the entire top surface 66 of die 62 and directly attached to electrical element 96 along the entire bottom edge surface 92 of cap 80, cap 80 provides a very good thermal path for the dissipation of heat from die 62. Also, since die 80 is also directly connected to the external element using solder bumps 76 and 78, these connections also provide good heat dissipating paths. Therefore, this package arrangement provides substantially improved heat dissipating characteristics when compared with the conventional packages of FIGS. 1 and 2.

In order to reduce the stress due to thermal expansion on the connection between cap 80 and element 96 and solder bumps 76 and 78, an additional non-conductive adhesive material 100 may be used to assist in mechanically holding package 60 attached to element 96. As shown in FIG. 3A, material 100 surrounds bumps 76 and 78 and provides additional attachment area which improves the attachment of the package to element 96.

Another advantage which this package arrangement provides is that source and drain input/output terminals 70 and 74 on die 62 are electrically connected to element 96 using only one relatively large conductor. In the case of the source, this is solder bump 76 and for the drain it is cap 80. This arrangement reduces the problems associated with resistance spreading which may occur when a package such as the package illustrated in FIG. 2 is used. Since package 40 of FIG. 2 uses several separate leads to electrically connect the source and the drain to the external electrical elements, resistance spreading issues may occur.

Although this embodiment of the present invention has been described above as including a discrete transistor die, it should be understood that this is not a requirement. Instead, a wide variety of dies may be incorporated into the above described package arrangement. For example, flip chip die of all types may be used in this type of package and remain within the spirit and scope of the invention. In these cases, the flip chip die has a plurality of input/output terminals on its bottom surface and, for example, a ground terminal or a power terminal on its top surface. As described above for the discrete transistor package, each of the input/output terminals on the bottom of the die is electrically connected to and associated with a solder ball or bump and the electrically conductive cap of the package is attached to the top surface of the die using an electrically conductive adhesive. As also described above, the solder balls or bumps and the bottom edge of the cap are disposed in a common plane allowing the package to be electrically connected to external elements such as a PC board thereby electrically connecting the die to the external element.

Although the electrically conductive cap has been described above as being a single piece which is only capable of electrically connecting one terminal on the top of the die to the external element, this also is not a requirement. In situations where more than one input/output terminal are located on the top surface of the die, the cap may be subdivided into segments which are electrically isolated from one another. Each of these electrically isolated segments corresponds to an associated input/output terminal on the top of the die and is electrically connected to that associated input/output terminal using electrically isolated segments of an electrically conductive adhesive which correspond to the segments of the cap.

In other embodiments of the invention, the cap may not be used in any way to electrically connect the die to external elements. Instead, the disclosed package simply provides improved heat dissipating characteristics. In these embodiments the die does not include any input/output terminals on its top surface. The cap is still attached to the top surface of the die, however, the cap only provides a thermal path from the top of the die to the external element to which the package is attached.

In still other embodiments, the solder bumps, solder balls, or contacts may be replaced with other arrangements for electrically connecting the input/output terminals on the bottom surface of the die to external elements. This arrangement for electrically connecting the input/output terminals on the bottom of the die to other external elements may take on a wide variety of forms and still remain within the spirit and scope of the present invention.

Figure 4:
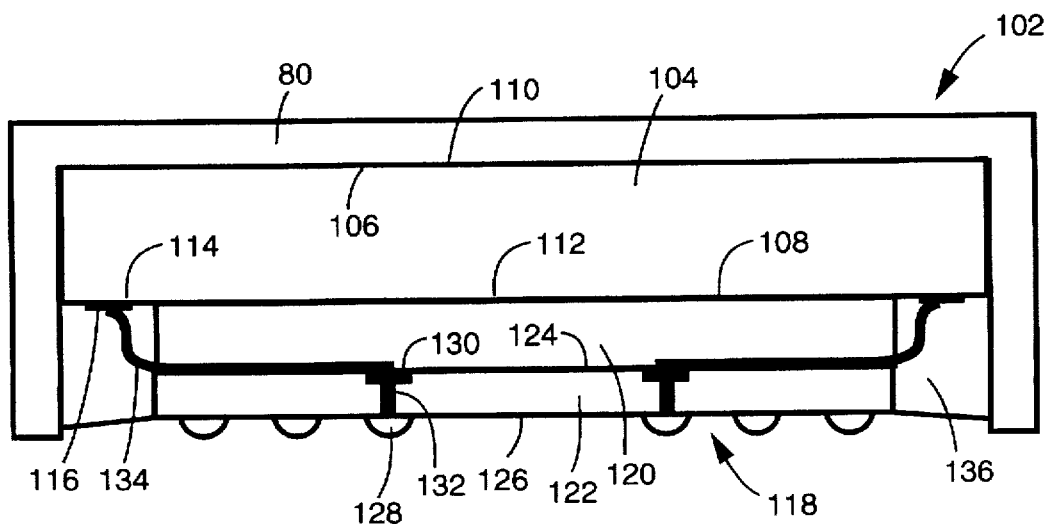
FIG. 4 is an elevational diagrammatic illustration of an integrated circuit package designed in accordance with a second embodiment of the present invention.

Referring now to FIG. 4, a package generally indicated by reference numeral 102 includes one particular alternative arrangement for electrically connecting the input/output terminals on the bottom of the die to other external elements. In this embodiment, package 102 includes cap 80 as described above and die 104. Die 104 includes a top surface 106, a bottom surface 108, and an input/output terminal 110 on its top surface which is electrically connected to cap 80 as described in detail above. However, bottom surface 108 of die 104 includes a central portion 112 and a peripheral portion 114 and die 104 includes a plurality of input/output terminals 116 positioned around the outer peripheral portion 114 of bottom surface 108. Also, instead of including the solder bumps to attach the input/output terminals on the bottom of the die to the external element as describe above for FIGS. 3A and 3B, package 102 includes arrangement 118 to electrically connect these terminals to external elements.

As shown in FIG. 4, arrangement 118 includes an elastomer layer 120 attached to central portion 112 of bottom surface 108 of die 104 which acts as a compliant layer to absorb physical shock to the package and help prevent the package from becoming electrically disconnected from other electrical elements as a result of the physical shocks. Arrangement 118 also includes a polyimide film 122 having i) a top surface 124 which is attached to the bottom surface of elastomer film 120, ii) a bottom surface 126 with a plurality of electrically conductive contacts or bumps 128 attached to bottom surface 126, iii) a plurality of electrically conductive contact pads 130 on its top surface 124, and iv) a plurality of electrically conductive vias or traces illustratively represented by line 132 in FIG. 4 electrically connecting respective ones of contact pads 130 to a corresponding contact or bump 128. An array of bonding wires 134 electrically connect respective ones of input/output terminals 116 to corresponding ones of contact pads 130 on top surface 124 of polyimide film 122 thereby electrically connecting each input/output terminal to a corresponding one of the electrically conductive contacts or bumps 128 on bottom surface 126 of polyimide film 122. Finally, package 102 includes, an encapsulating material 136 surrounding bonding wires 134 which is intended to prevent damage to or electrical shorting of bonding wires 134.

It should be understood that the present invention may be embodied in many other specific forms without departing from the spirit or scope of the invention. For example, although only two specific arrangements for electrically connecting the input/output terminals on the bottom surface of the die to external elements have been described in detail, it should be understood the arrangement for making these connections may take on a wide variety of conventional forms. Also, although the cap has been described as having downwardly projecting sidewalls which completely surround the die and project below the bottom surface of the die, this is not a requirement. Other embodiments may only have portions of the sidewalls projecting downward below the bottom surface of the die. The present invention would apply so long as at least a portion of the cap is arranged to be directly connected to an external element with this connection providing either an arrangement for electrically connecting an input/output terminal on the top surface of the die to an external element or providing a direct thermal path from the die to the external element.

Therefore, the present examples are to be considered as illustrative and not restrictive, and the invention is not to be limited to the details given herein, but may be modified within the scope of the appended claims.

What is claimed is:

1. An integrated circuit package comprising:
   a) a die having a top surface, a bottom surface, an edge surface, a plurality of input/output terminals on said bottom surface of said die, and an input/output terminal pad on said top surface of said die;
   b) electrically conductive means for electrically connecting said input/output terminals on said bottom surface of said die to other electrical elements;
   c) an electrically conductive cap attached to said top surface of said die, said cap providing an electrically conductive path for electrically connecting said input/output terminal pad on said top surface of said die to an external electrical element which is external to said integrated circuit package: and
   d) an electrically conductive material electrically connecting said input/output terminal pad on said top surface of said die to said electrically conductive cap.

2. An integrated circuit package according to claim 1 wherein:
   a) said electrically conductive means has a plurality of lowermost individual electrically conductive members disposed within a common plane and adapted to be electrically connected to said other electrical elements; and
   b) said cap has an inverted cup shape and includes a base member and at least one downwardly projecting sidewall, said base member having an inner top surface to which said die is attached, said sidewall extending downward below said bottom surface of said die and said sidewall having a bottom edge surface located in said common plane and being adapted to be electrically connected to said external electrical element, thereby electrically connecting said input/output terminal pad on said top surface of said die to said external electrical element.

3. An integrated circuit package according to claim 2 wherein said sidewall extends continuously around said base member of said cap.

4. An integrated circuit package according to claim 2 wherein said bottom edge surface of the sidewall of said cap is solder plated, said solder plating being adapted to facilitate electrically connecting said edge surface of said cap to said external electrical element such as a circuit board.

5. An integrated circuit package according to claim 1 wherein said cap further includes an electrically non-conductive coating on its outer surface.

6. An integrated circuit package according to claim 1 wherein said die is attached to said cap using an electrically conductive die attach material, said electrically conductive die attach material acting as said electrically conductive material electrically connecting said input/output terminal pad on said top surface of said die to said electrically conductive cap.

7. An integrated circuit package according to claim 1 wherein said cap is constructed of a thermally conductive material and wherein said die is attached to said cap using a thermally conductive die attach material thereby providing heat dissipation for said package.

8. An integrated circuit package according to claim 1 wherein:

a) said integrated circuit package further includes
      (i) a layer of compliant material having a bottom surface and a top surface attached to said bottom surface of said die and
      (ii) a layer of polyimide material having a bottom surface, a top surface attached to said bottom surface of said layer of compliant material, an array contact pads on said bottom surface, an array of bonding pads on said top surface, and an array of traces electrically connecting respective ones of said bonding pads on said top surface to corresponding contact pads on said bottom surface; and b) said electrically conductive means for electrically connecting said input/output terminals on said bottom surface of said die to other electrical elements includes
      i) an array of contacts attached to said contact pads on the bottom surface of said polyimide material; and
      ii) an array of bonding wires electrically connecting said plurality of input/output terminals on said bottom surface of said die to respective ones of said bonding pads on said top surface of said layer of polyimide material.

9. An integrated circuit package according to claim 8 further including an encapsulating material surrounding and encapsulating said bonding wires.

10. An integrated circuit package according to claim 1 wherein said electrically conductive means for electrically connecting said input/output terminals on said bottom surface of said die to other electrical elements includes a plurality of electrically conductive contacts attached to said input/output terminals on said bottom surface of said die, said contacts being adapted to electrically connect said input/output terminals on said bottom surface of said die to other electrical elements.

11. An integrated circuit package according to claim 10 wherein said plurality of electrically conductive contacts are solder balls.

12. An integrated circuit package according to claim 10 wherein said array of electrically conductive contacts are electrically conductive bumps formed from an alloy including nickel and gold.

13. An integrated circuit package according to claim 6 wherein said die attach material is an electrically conductive epoxy.

* * * * *